United States Patent
Bemmerl et al.

(10) Patent No.: US 7,737,537 B2
(45) Date of Patent: Jun. 15, 2010

(54) ELECTRONIC DEVICE

(75) Inventors: Thomas Bemmerl, Schwandorf (DE); Thomas Mende, Düsseldorf (DE); Bernd Rakow, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 133 days.

(21) Appl. No.: 11/954,590

(22) Filed: Dec. 12, 2007

(65) Prior Publication Data

US 2009/0152694 A1 Jun. 18, 2009

(51) Int. Cl.
*H01L 23/495* (2006.01)
*H01L 21/60* (2006.01)

(52) U.S. Cl. ............... 257/670; 257/666; 257/E23.031; 257/E21.51

(58) Field of Classification Search .................. 257/672, 257/E23.004, E23.043–E23.05
See application file for complete search history.

(56) References Cited

U.S. PATENT DOCUMENTS

| | | | |
|---|---|---|---|
| 6,034,423 A | 3/2000 | Mostafazadeh et al. | |
| 6,198,163 B1 | 3/2001 | Crowley et al. | |
| 6,285,075 B1 | 9/2001 | Combs et al. | |
| 6,437,427 B1 | 8/2002 | Choi | |
| 6,472,737 B1 | 10/2002 | Corisis et al. | |
| 6,608,366 B1 | 8/2003 | Fogelson et al. | |
| 6,630,733 B2 | 10/2003 | Corisis et al. | |
| 7,135,760 B2 | 11/2006 | Han et al. | |
| 2002/0024122 A1* | 2/2002 | Jung et al. | 257/666 |
| 2004/0238921 A1 | 12/2004 | Lee et al. | |
| 2005/0263861 A1 | 12/2005 | Ahn et al. | |
| 2008/0061411 A1* | 3/2008 | Shen et al. | 257/670 |
| 2008/0067639 A1* | 3/2008 | Do et al. | 257/666 |

* cited by examiner

*Primary Examiner*—Fernando L Toledo
*Assistant Examiner*—Mamadou Diallo
(74) *Attorney, Agent, or Firm*—Dicke, Billig & Czaja, PLLC

(57) ABSTRACT

Embodiments provide an electronic device. The electronic device includes a leadframe having a first face that defines an island and multiple leads configured to communicate with a chip attached to the island, a first structure element separate from and coupled to a first face of the leadframe, at least one electrical connector coupled between the chip and the first structure element, and at least one electrical connector coupled between the first structure element and one of the multiple leads.

7 Claims, 18 Drawing Sheets

ELECTRONIC DEVICE

BACKGROUND

Integrated circuit chips are conventionally enclosed in a package that provides protection from environmental conditions. One form of package is a leadless package having a carrier that defines an interface for electrical connection to other devices. Another form of package is a leaded package having leads that enable electrical interconnection between the chip and another electrical component, such as a printed circuit board or a motherboard. One such leaded semiconductor package is a Quad Flat Package including a supporting leadframe, one or more chips electrically coupled to the leadframe, encapsulating material molded over the leadframe and the chip(s), and multiple leads extending from the encapsulating material.

The leadframe is stamped or etched from metal to include the die pad or island, tiebars extending from die pad, a power bar, and a ground ring configured to communicate with die pad, and the leads. The leads include input/output leads, at least one lead coupled to the power bar, and at least one lead coupled to the ground ring. Connectors are suitably wired between the leads and the chip. The power bar and the ground ring are connected to predefined leads. As a consequence, and by necessity, some of the leads are connected to power bar and some of the leads are connected to ground ring. Utilizing the leads to connect with the power bar and/or the ground ring undesirably reduces the number of remaining and available input/output leads for forming an electrical pathway to chip. In addition, each new chip layout calls for a different leadframe design.

For these and other reasons there is a need for the present invention.

SUMMARY

One aspect provides an electronic device including a leadframe having a first face that defines an island and multiple leads configured to communicate with a chip attached to the island, a first structure element separate from and coupled to a first face of the leadframe, at least one electrical connector coupled between the chip and the first structure element, and at least one electrical connector coupled between the first structure element and one of the multiple leads.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. As employed in this Specification, the term "electrically coupled" does not mean that the elements must be directly coupled together; intervening elements may be provided between the "electrically coupled" elements.

A semiconductor package is provided that is configured to have a flexible, open tool leadframe design useful for high performance package/chips and other circuits. The flexible, open tool leadframe design includes power/ground elements that are connected to the leadframe independently of, and separately from, input/output leads coupled to the leadframe.

The flexible, open tool leadframe design accommodates high performance package/chips and other packaging solutions.

In one embodiment, at least one power/ground element is provided separately and in addition to the leadframe and configured for selective electrical coupling, which leaves one or more leads additionally available for coupling to a signal, or a power bar, or a ground ring.

Embodiments described below provide a leadframe having one or more power/ground elements that are separate from and coupled to the leadframe, for example on top of an upper face of the leadframe. The power/ground elements are independent from the leadframe such that the input/output leads are available for selected signal or other electrical connections.

In one embodiment, a semiconductor package includes a ground ring provided at a reference voltage, a first power/ground element provided at a first voltage different from the reference voltage, and a second power/ground element provided at a second voltage different from the reference voltage and the first voltage. Such a semiconductor package is compatible with chip-on-chip, chip side-by-side chip, and multi-chip semiconductor designs.

Figure 1:
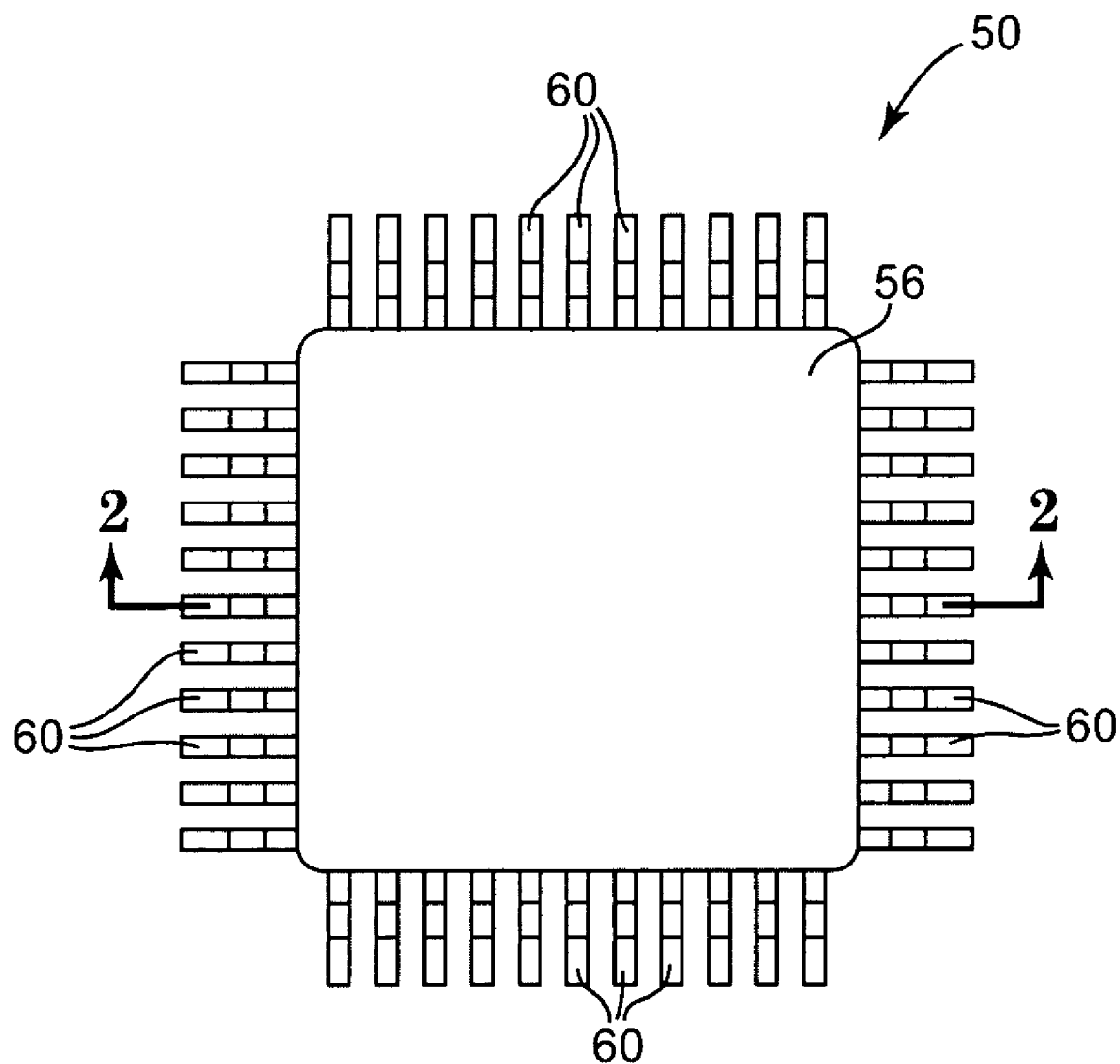
FIG. 1 is a top view of a semiconductor package according to one embodiment.

FIG. 1 is a top view of a semiconductor package 50, or electronic device 50, according to one embodiment. Electronic device 50 includes encapsulation material 56 molded over a chip that is attached to a leadframe and leads 60 extending from encapsulation material 56. In one embodiment, semiconductor package 50 includes a leaded Quad Flat Package (QFP). Other package forms are also acceptable, such as Dual-In-line packages (DIP) or Quad Flat Non-leaded (QFN) packages.

Figure 2:
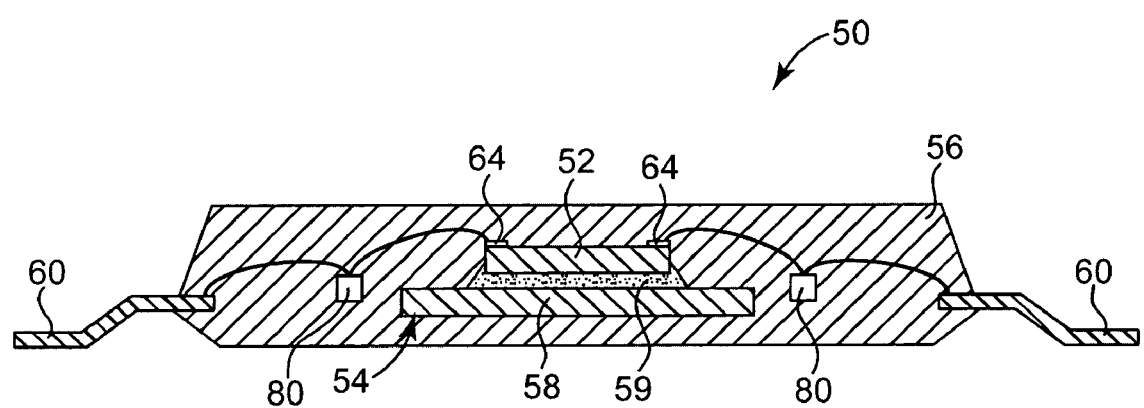
FIG. 2 is a cross-sectional view of the semiconductor package of FIG. 1 including a structure element separate from and coupled to a face of a leadframe.

FIG. 2 is a cross-sectional view of semiconductor package 50 shown in FIG. 1 including a structure element 80 separate from and coupled to a face of a leadframe 54. In one embodiment, leadframe 54 includes die pad 58/island 58, leads 60 that provide input/output terminals suited for electrical connection to pads 64 on chip 52, and a ground ring 66 that is connected to island 58. Chip 52 is attached to die pad/island 58 by adhesive 59 or epoxy 59 or other die attach material like soft solder or tape. In one embodiment, chip 52 is grounded by down bonding a bond wire between pad 64 of chip 52 and die pad 58.

In a conventional leadframe design, electrically coupling the chip to the leads limits the number of available leads that remain for bringing signals into and out of chip. In contrast, structure element 80 is attached to a portion of leadframe 54 as described below and provides leadframe 54 with a flexible open tool leadframe design that accommodates high performance chips 52 and/or packaging solutions. Structure element 80 includes power/ground elements that are separate from and in addition to the leadframe 54 that enable the selective electrical coupling to and from chip 52. In this manner, more leads 60 are made available for signal coupling since the power delivery and grounding functions for package 50 are separately accommodated by structure element 80.

Chip 52 includes semiconductor chips in general, memory and/or logic chips, integrated circuits having vertical power transistors, or any chip suitable for use in a semiconductor package. Leadframe 54 is generally stamped from a metal sheet or etched upon a metal sheet. Other forms of leadframe 54 are also acceptable. In one embodiment, leadframe 54 and leads 60 are stamped from a leadframe strip of copper. In one embodiment, leadframe 54 is a leaded Quad Flat Pack leadframe and leads 60 extend from encapsulation material 56. Encapsulation material 56 electrically insulates package 50 and includes epoxy, cross-linked or cross-linkable polymer, resin or other electrically insulating material suited for molding and/or encapsulating chip 52.

Figure 3A:
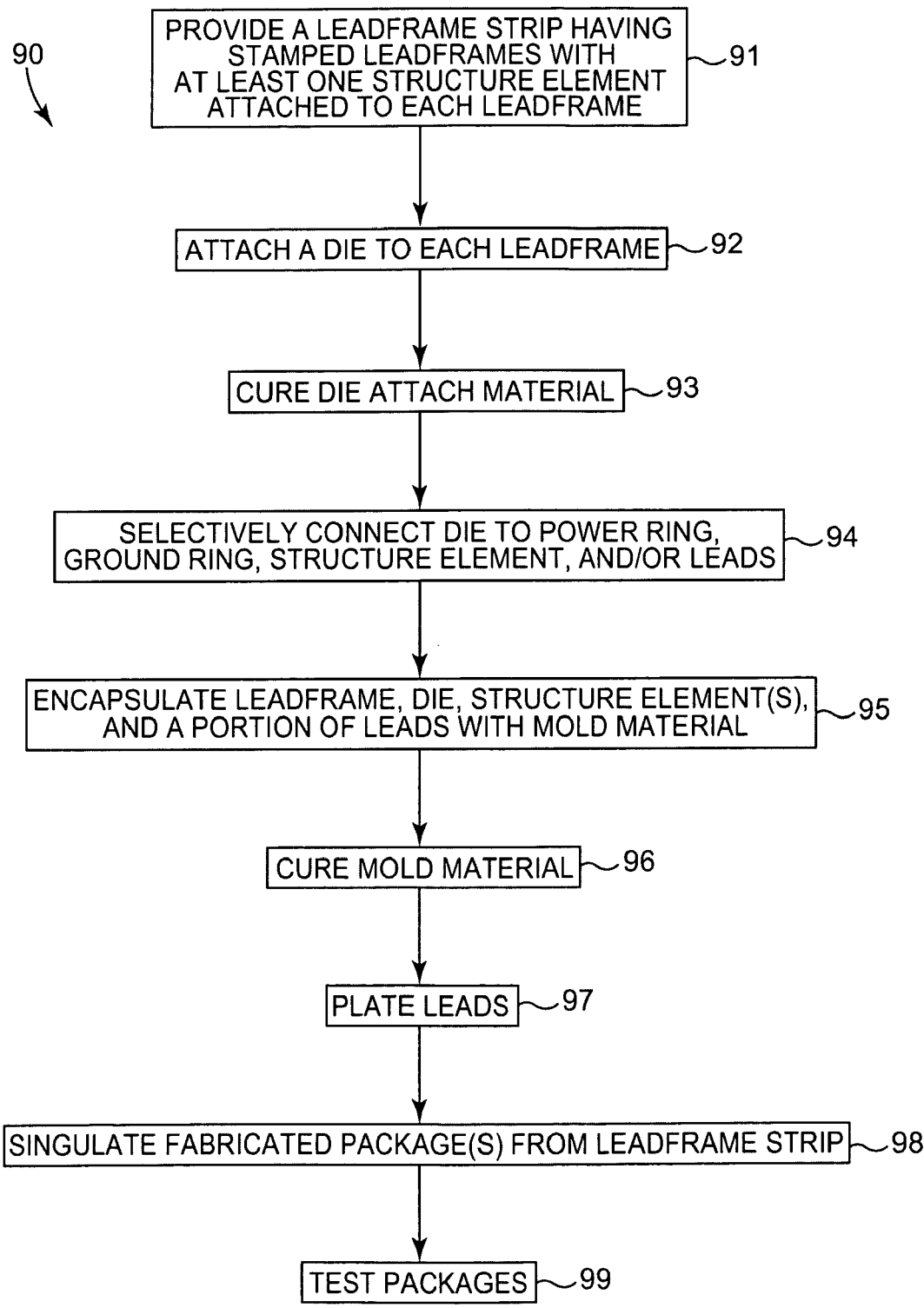
FIG. 3A is a flow chart of a fabrication process for a semiconductor package including an open tool leadframe according to one embodiment.

FIG. 3A is a flow chart 90 of a process for fabricating a semiconductor package 50 including an open tool leadframe 54 having a structure element 80 according to one embodiment as represented by FIGS. 3B-3F.

With dual reference to FIG. 3A and FIGS. 3B-3F, flow chart 90 provides a process 91 in which at least one leadframe 54 is stamped or etched from a leadframe strip 81 and includes at least one structure element 80 attached to the leadframe 54. In one embodiment, a supplier provides leadframe strip 81 that is suitably formed to include structure element 80 attached to the leadframe 54. Structure elements 80, 86 include simple and cost-effective elements such as conductive bars or strips including metal bars, metal frames, metal strips, and the like. One suitable metal includes copper, although other metals are also acceptable. Two leadframes 54 are illustrated, but in one embodiment leadframe strip 81 includes an array of leadframes 54 such as a 2×8 array of leadframes 54, or a 1×8 array of leadframes 54, or a 4×16 array of leadframes 54 as examples.

A process 92 is provided in which die 52 is attached to island 58 of leadframe 54. In one embodiment, die 52 is adhesively bonded or soldered to island 58 by attachment material 59. In one embodiment, chip 52 includes an integrated circuit having a vertical power transistor, and chip 52 is attached to island 58 with a conducting attachment material 59 to enable current to flow from a top (source) of chip 52 to a backside (drain) of chip 52. Leadframe 54 and structure elements 80 are configured to accommodate a wide range of selected chips 52.

In one embodiment, a process 93 is provided in which the die attachment material 59 is thermally cured. Other forms of curing die attachment material 59 or no curing at all (e.g., in the case where the die is attached with solder) are also acceptable.

Process 94 provides the selective electrical interconnect between chip 52 and leadframe 54, including connections to structure elements 80, 86 and leads 60. In one embodiment, connections between chip 52 and leadframe 54/elements 80, 86 are formed with gold wires. Other connectors are also acceptable. Leadframe 54 and structure elements 80 are configured to accommodate a wide range of varying wiring patterns, which enables a wide range of packaging solutions.

Process 95 provides for encapsulating leadframe 54, chip 52, structure elements 80, 86, and a portion of leads 60 with plastic. In one embodiment, these components are over-molded in a cavity mold in a manner that enables stresses in leadframe 54 to be relieved prior to molding. Subsequent to removing the molded leadframe strip 81 from the mold cavity, the plastic is allowed to cool and harden.

In one embodiment, a process 96 is provided in which the plastic mold material is cured to achieve the desired characteristics for the exterior of package 50. One suitable cure process is a thermal cure, although other curing processes, such as radiation curing, are also acceptable.

In one embodiment, a process 97 is provided in which leads 60 are plated with a material that resists oxidation. In one embodiment, leads 60 are plated with tin, or an alloy of tin. Other forms of plating of leads 60 are also acceptable. Process 97 is an optional process in the case where a pre-plated leadframe is employed.

In one embodiment, a process 98 is provided in which packages 50 are singulated from leadframe strip 81 by severing leads 60 from leadframe strip 81. Thereafter, the singulated packages 50 are evaluated in a test process 99 to ensure and validate the desired package performance.

Figure 3B:
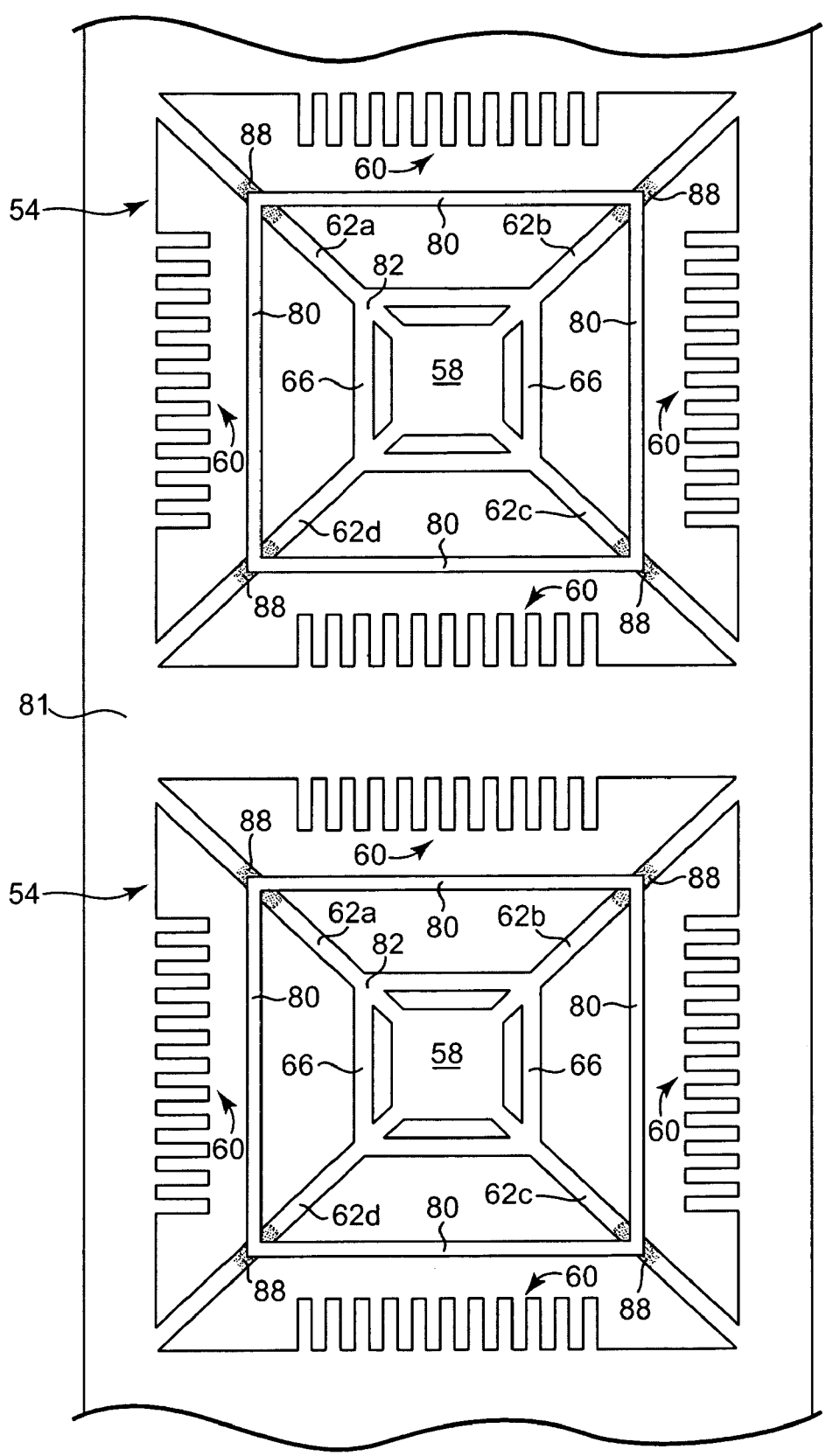
FIG. 3B is a top view of a portion of leadframe strip including a structure element coupled to tiebars of a leadframe according to one embodiment.

FIG. 3B is a top view of a portion of leadframe strip 81 including two leadframes 54 formed from strip 81 each having a structure element 80 coupled to tiebars 62 of leadframe 54 according to one embodiment.

In one embodiment, leadframe strip 81 includes copper and leadframe 54 is stamped from strip 81 to include island 58, leads 60, tiebars 62 that extend from island 58 to support package 50 (FIG. 1) during fabrication, and a ground ring 66 that is connected to island 58. In one embodiment, ground ring 66 is stamped from leadframe strip 81 and provided separately from die pad 58. In another embodiment, ground ring 66 is not provided and ground connections are made directly to die pad 58. In one embodiment, four tiebars 62a, 62b, 62c, and 62d extend from four corners of island 58 such that tiebars 62a and 62d are each adjacent (or apposed) to tiebars 62b and 62c. In a like manner, tiebars 62b and 62c are each adjacent to tiebars 62a and 62d.

In one embodiment, structure element 80 is attached to tiebars 62 by electrically insulating material 88 that is deposited onto at least a portion of each tiebar 62a-d, and structure elements 80, 86 are adhered to material 88 on top of tiebars 62a-d. Structure elements 80, 86 are thus separate from and coupled to first face 82 (or top) of leadframe 54. In one embodiment, electrically isolating material 88 is an insulating double-sided adhesive tape, although other forms of electrically isolating material are also acceptable.

Figure 3C:
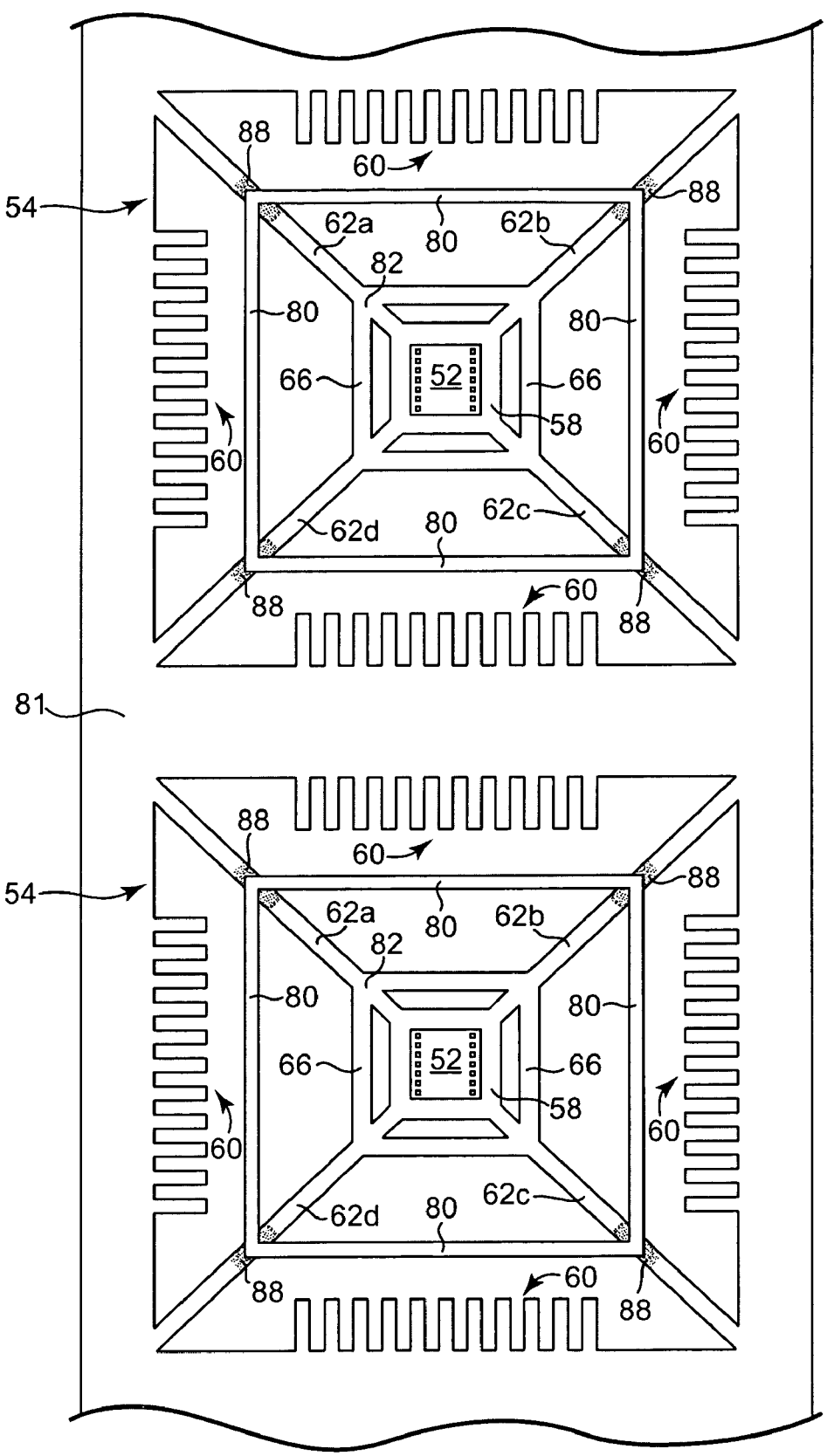
FIG. 3C is a top view of the leadframe strip of FIG. 3B including a chip attached to an island of the leadframe according to one embodiment.

FIG. 3C is a top view of the leadframe strip 81 of FIG. 3B including chip 52 attached to island 58 of leadframe 54 by attachment material 59.

Figure 3D:
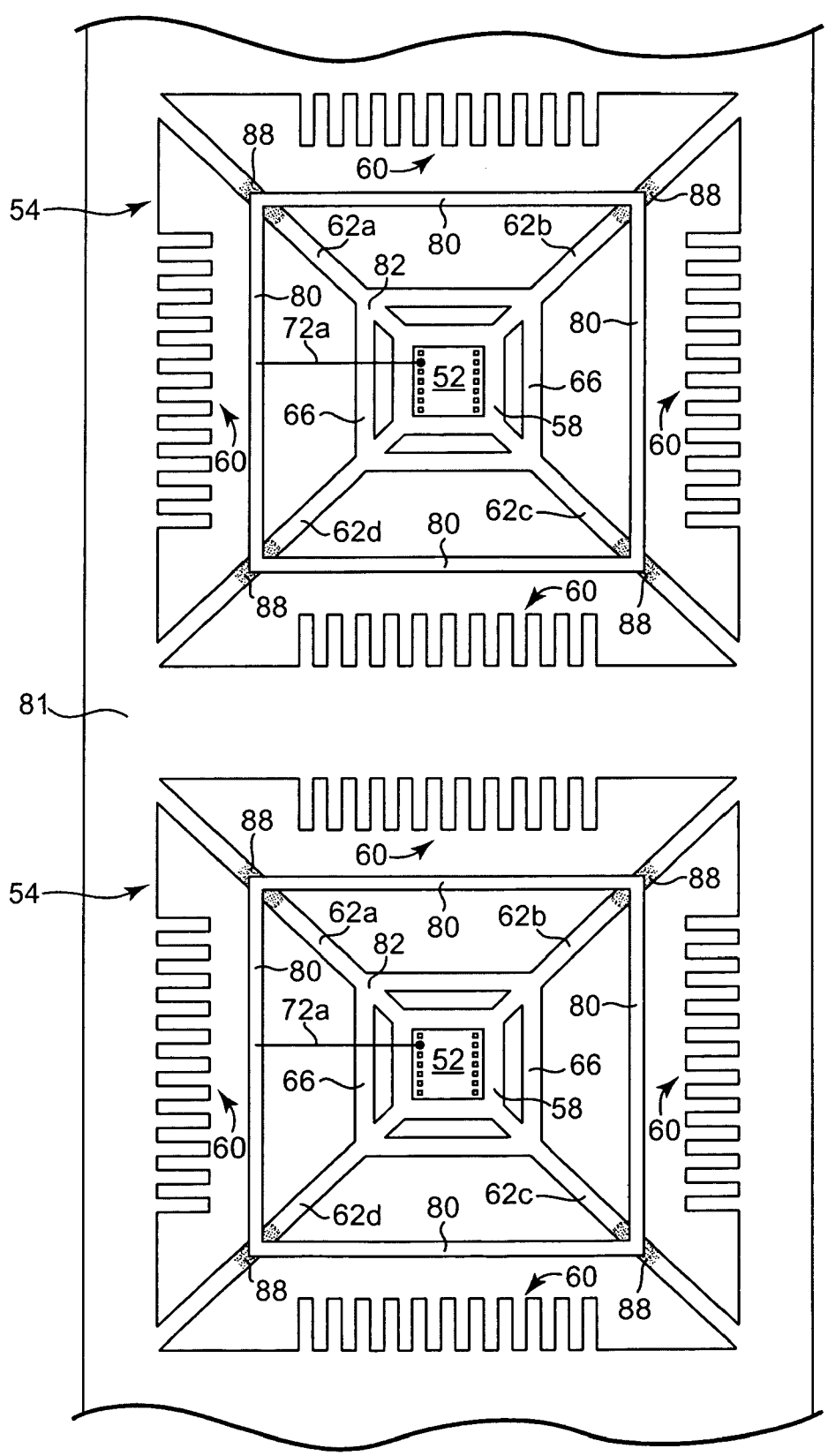
FIG. 3D is a top view of the leadframe strip of FIG. 3C including a connector electrically connected between the chip and the structure element according to one embodiment.

FIG. 3D is a top view of the leadframe strip 81 of FIG. 3C including a connector 72a electrically connected between chip 52 and structure element 80 according to one embodiment. In one embodiment, chip 52 and includes pads 64 that are configured to electrically couple chip 52 to the "outside world," and connector 72a electrically connects between pad 64 and structure element 80. In one embodiment, connector 72a includes wires, wire bond connectors, clips, etc., although other connectors are also acceptable.

In one embodiment, structure element 80 is a power bus and connector 72a connects chip 52 to power bus 80. In one embodiment, structure element 80 is a ground, and connector 72a connects chip 52 to ground.

Figure 3E:
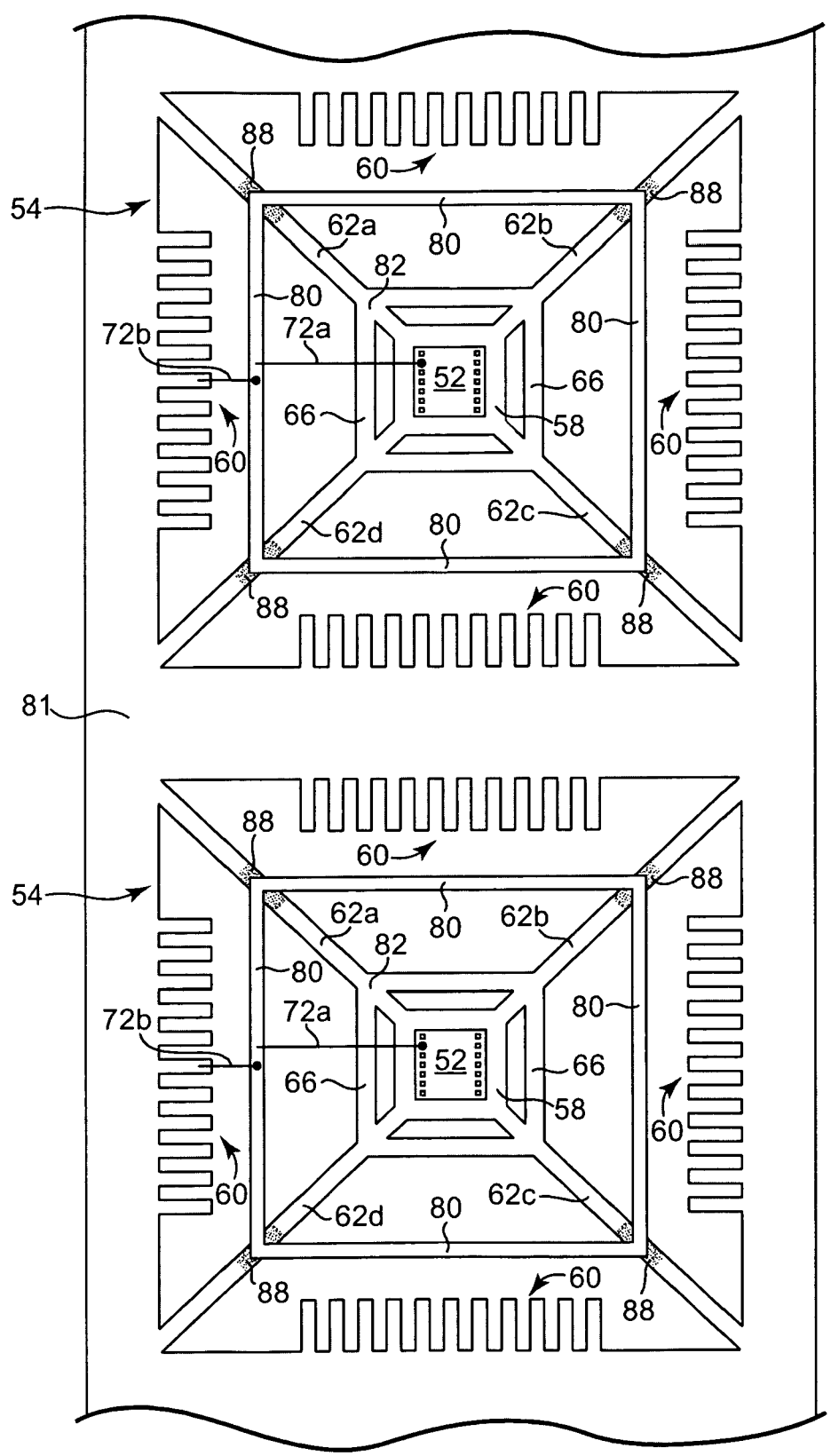
FIG. 3E is a top view of the leadframe strip of FIG. 3D including a connector electrically connected between the structure element and a lead of the leadframe according to one embodiment.

FIG. 3E is a top view of the leadframe strip 81 of FIG. 3D including a connector 72b electrically connected between structure element 80 and a lead 60 of the leadframe 54. Connector 72b is similar to connector 72a. In one embodiment, structure element 80 is a power bus and connector 72b connects lead 60 to element 80 to power package 50. In one embodiment, structure element 80 is a ground, and connector 72b connects lead 60 to ground.

Figure 3F:
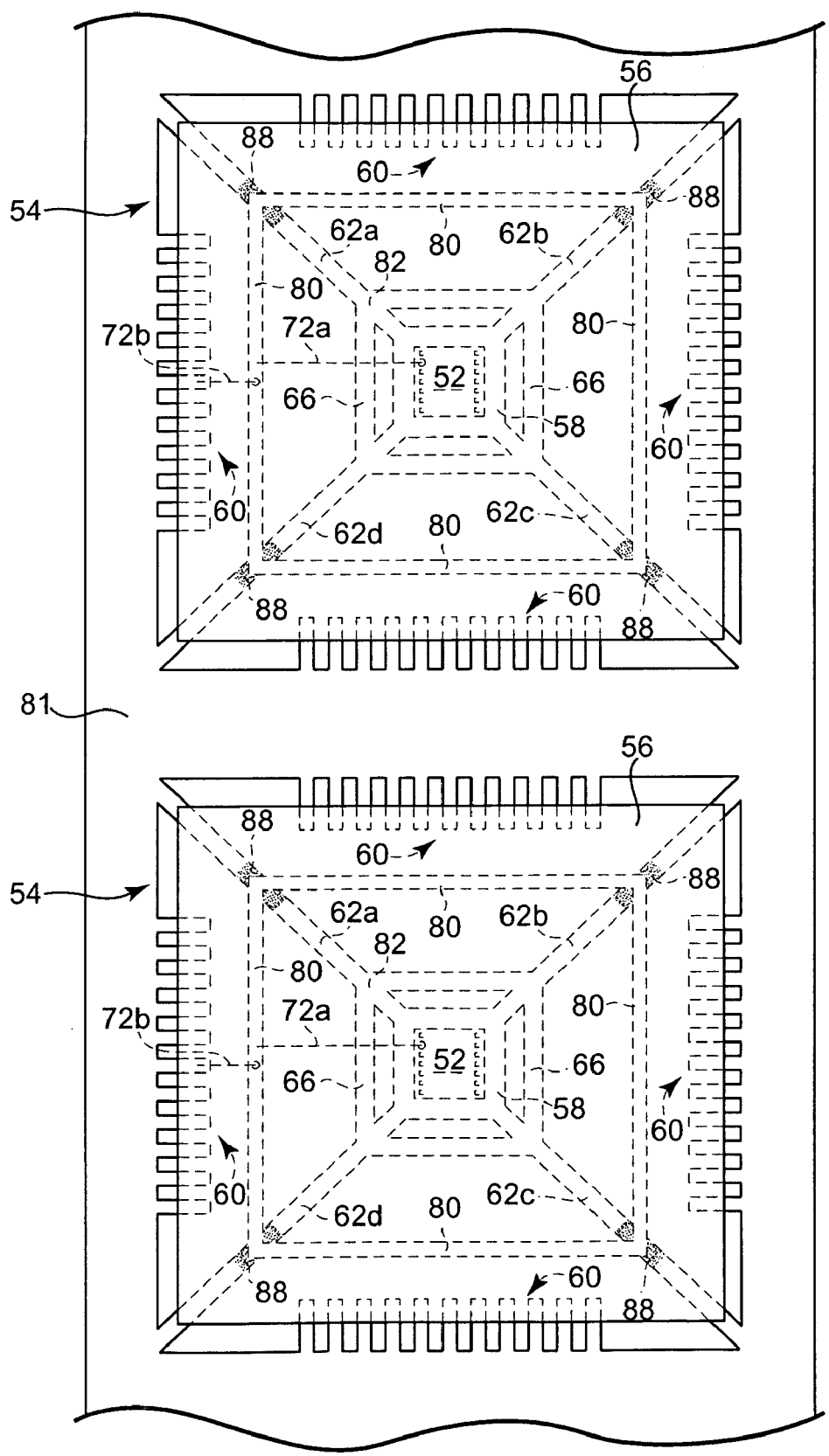
FIG. 3F is a top view of the leadframe shown in FIG. 3E including encapsulation material molded over the leadframe, the chip, the structure element, and a portion of the leads according to one embodiment.

FIG. 3F is a top view of the connected leadframe 54 shown in FIG. 3E including encapsulation material 56 molded over leadframe 54, chip 52, structure element 80, and a portion of the leads 60 to provide a QFP package 50 according to one embodiment.

In one embodiment, package 50 is singulated or severed from leadframe strip 81 after encapsulation by mold material 56. For example, leads 60 and tiebars 62a-62d are severed from leadframe strip 81, leaving leads 60 extending from encapsulation material 56. Package 50 is thus ready for testing and configured for electrical connection to other electronic devices, such as printed circuit boards and/or motherboards.

Figure 3G:
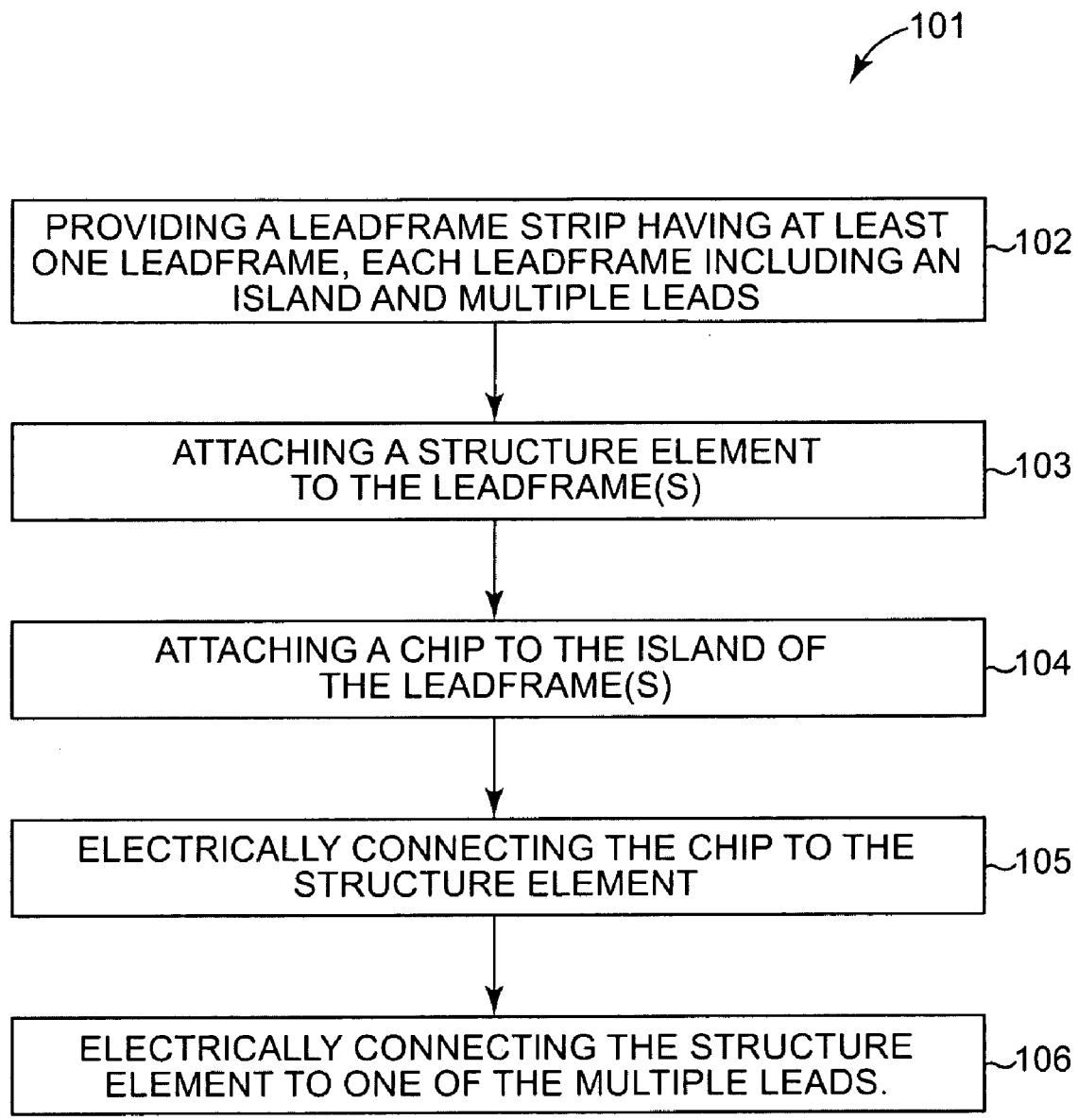
FIG. 3G is a flow chart of another fabrication process for a semiconductor package including an open tool leadframe according to one embodiment.

FIG. 3G is a flow chart 101 of another fabrication process for a semiconductor package including an open tool leadframe according to one embodiment. The process includes providing a leadframe strip having at least one leadframe, each leadframe including an island and multiple leads at 102; attaching a structure element to the leadframe(s) at 103; attaching a chip to the island of the leadframe(s) at 104; electrically connecting the chip to the structure element at 105; and electrically connecting the structure element to one of the multiple leads at 106.

Figure 4:
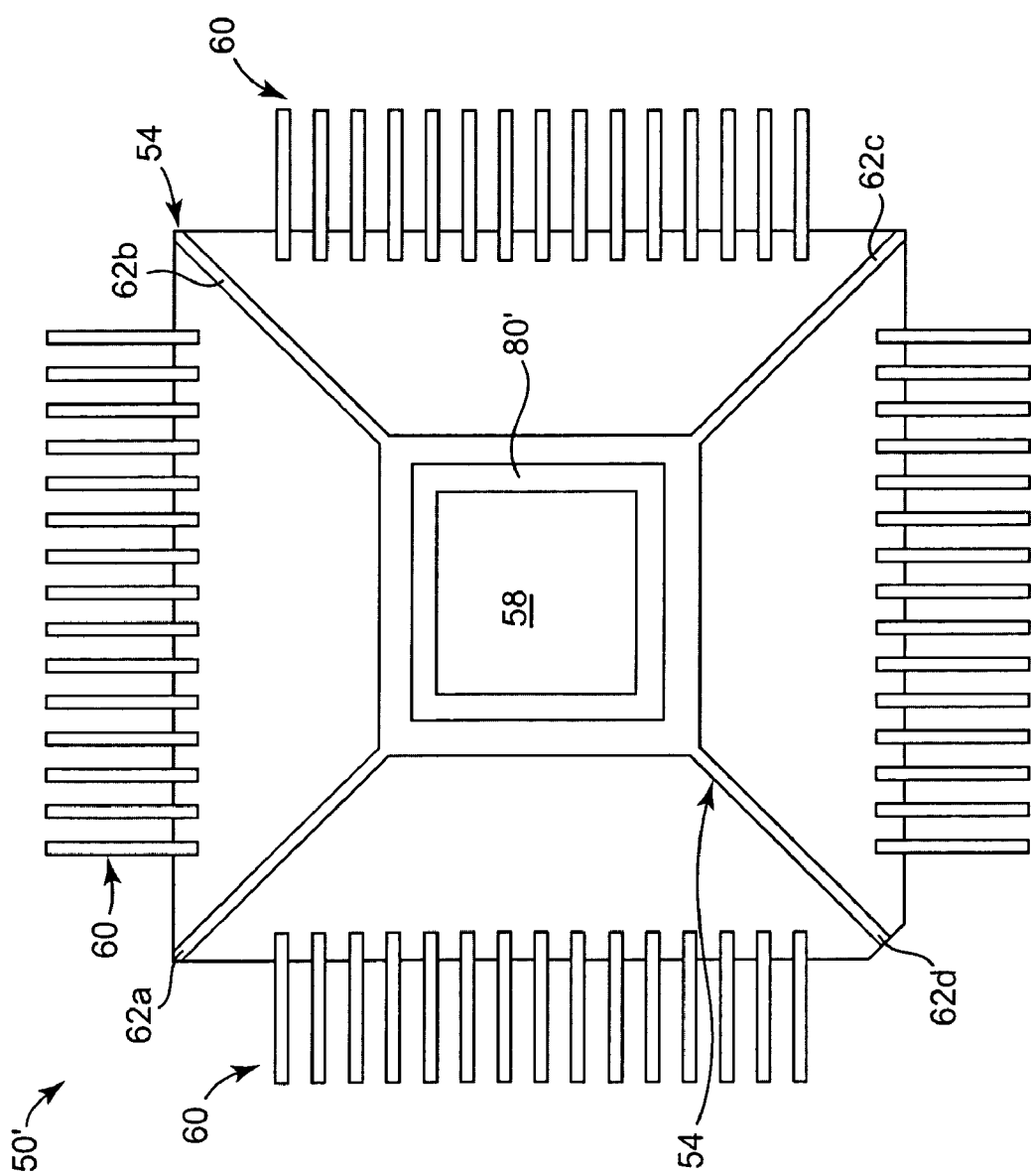
FIG. 4 is a top view of another semiconductor package including a structure element disposed on an island of a leadframe according to one embodiment.

FIG. 4 is a top view of another semiconductor package 50' including a structure element 80' disposed on island 58 of leadframe 54 according to one embodiment. Structure element 80' is separate from and coupled to a face of island 58 by an electrically insulating material, similar to material 88 described above. structure element 80' provides leadframe 54 with a flexible open tool leadframe design that accommodates high performance package/chips and other packaging solutions. Structure element 80' includes power/ground elements described above that are separate from and in addition to the leadframe 54 and is configured to enable the selective electrical coupling to and from chip 52, which provides more available leads 60 for signal coupling since the power delivery and grounding functions for package 50 are separately accommodated by structure element 80.

Figure 5:
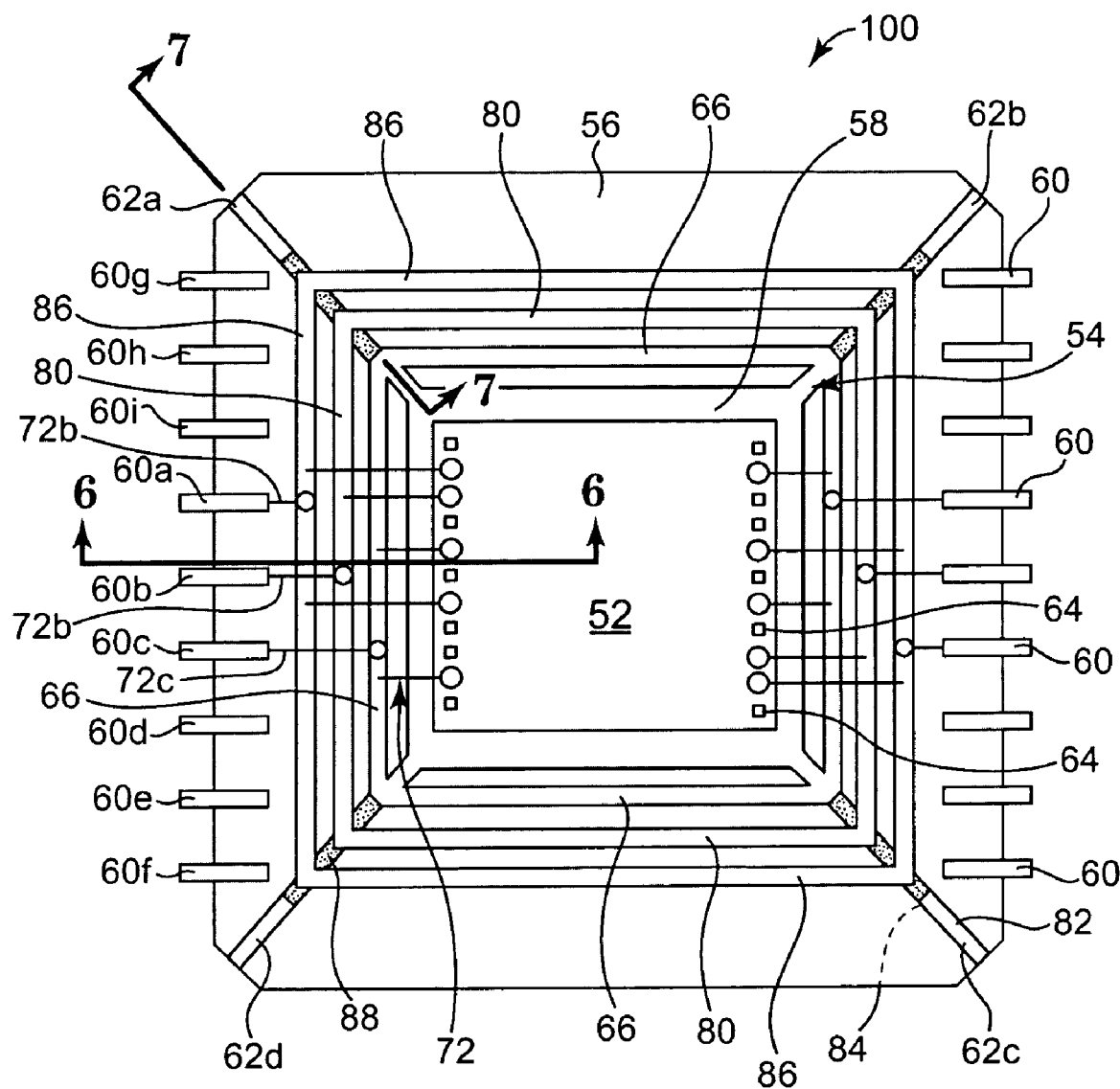
FIG. 5 is a top section view of a semiconductor package according to another embodiment.

FIG. 5 is a top section view of a semiconductor package 100 according to another embodiment including first structure element 80 disposed on leadframe 54 and a second structure element 86 is disposed on leadframe 54 separate from first structure element 80. A portion of encapsulating material 56 has been removed to better illustrate leadframe 54 and structure elements 80, 86.

In one embodiment, structure elements 80, 86 include metal bars, a metal strips, metal frames, metal wires, and are suitably formed from copper or other electrically conducive material. In general, structure elements 80, 86 are coupled to at least two tiebars 62 of leadframe 54 by an electrically insulating material, such as an adhesive, an epoxy, or a double-sided adhesive tape.

In one embodiment, ground ring 66 of leadframe 54 is maintained at a reference voltage of zero volts, first structure element 80 is a power ring maintained at, for example, 3.3 volts, and second structure element 86 is a ground/power ring maintained at a voltage different from zero and 3.3 volts. Structure elements 80, 86 include rings disposed around die pad 58, or separate strips parallel to one or more edges of die pad 58. Other configurations for structure elements 80, 86 are also acceptable.

With reference to the left hand side of FIG. 5, in one embodiment first lead 60a is wire bonded to power/ground structure element 86 by connector 72b, second lead 60b is wire bonded to power/ground structure element 80 by another connector 72b, and third lead 60c is wire bonded to ground ring 66 by another connector 72c, which leaves leads 60d, 60e, 60f, 60g, 60h, and 60i available for connection to signal, ground or power. The right hand side of FIG. 5 also provides a plurality of leads available for connection to signal, ground or power. Leads 60a-c have been connected with power bar 80 and ground ring 66. More or fewer leads 60 could be selectively coupled to power bar 80 and ground ring 66 such that leadframe 54 offers an open tool design structure having additional leads 60d-60i available for other connection configurations.

In one embodiment, the structure elements 80, 86 are stacked vertically while staggered horizontally, each respectively placed closer (or further) from die pad 58. In another embodiment, the structure elements 80, 86 are placed on the same plane, i.e., in a co-planar arrangement.

Figure 6:
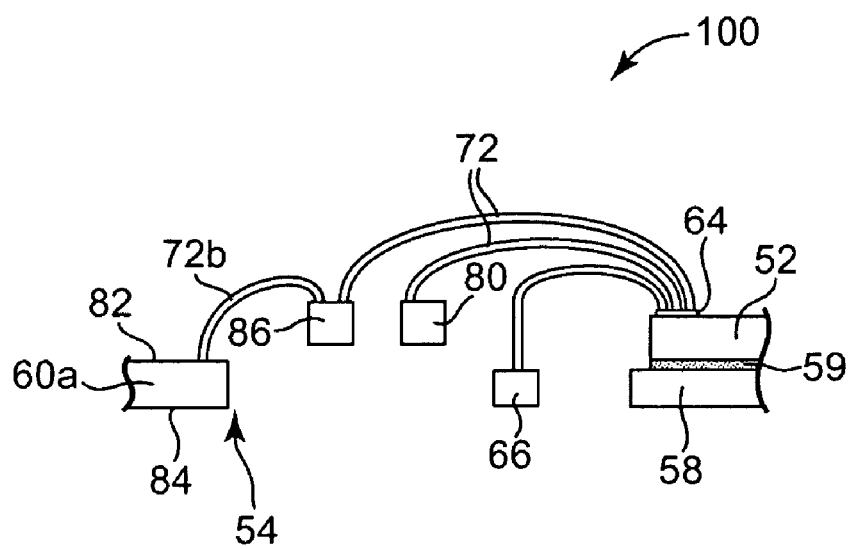
FIG. 6 is a cross-sectional view of the semiconductor package of FIG. 5 taken along line 6-6.

FIG. 6 is a cross-sectional view of the left side of package 100 taken through line 6-6 of FIG. 5. Tiebar 62a extends from tie pad 58, and in this view, lead 60a is in front of tiebar 62a.

In one embodiment, structure elements 80, 86 are coupled between apposed tiebars 62a, 62c by an electrically isolating material 88. The electrical isolation of structure elements 80, 86 enable the selective electrical coupling between lead 60a, structure elements 80, 86, and chip 52.

For example, leadframe 54 includes first face 82 opposite second face 84, and a first connector 72 extends between and electrically connects lead 60a and structure element 86. Another connector 72 extends between and electrically connects structure element 86 and pad 64 on chip 52. A separate connector 72 extends between and electrically connects structure element 80 to pad 64 of chip 52. A separate connector 72 extends between and electrically connects ground ring 66 with pad 64 on chip 52. As noted above, in one embodiment ground ring 66 is maintained at a reference voltage, structure element 80 is maintained at a voltage different than the reference voltage, and structure element 86 is maintained at a voltage that is different than the reference voltage (and the same or different than the voltage of structure element 80).

In one embodiment, a single wire connector or other connector is sufficient to electrically connect power/ground structure elements 80, 86. In one embodiment, ground ring 66 is formed as part of leadframe 54, as illustrated. In other embodiments, ground ring 66 is provided separate from and coupled to leadframe 54 by an isolating material, in a manner similar to structure elements 80, 86 as illustrated.

Figure 7:
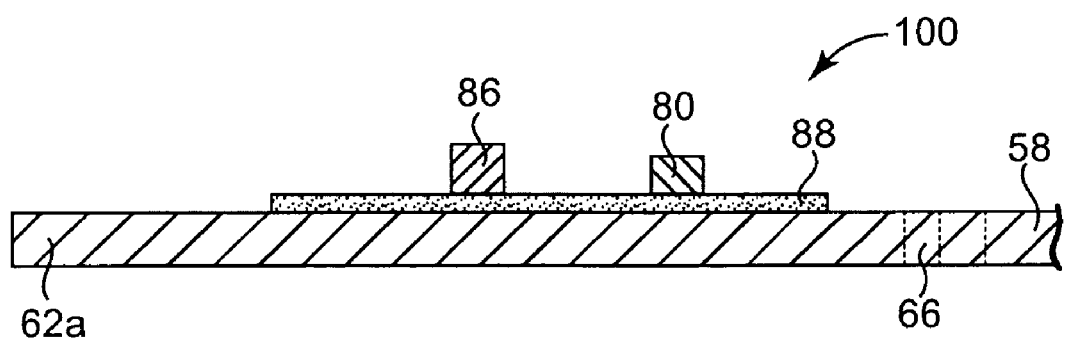
FIG. 7 is a cross-sectional view of the semiconductor package of FIG. 5 taken along line 7-7.

FIG. 7 is a cross-sectional view of the semiconductor package 100 of FIG. 5 taken along line 7-7. Tiebar 62a extends from island 58, ground ring 66 is integrally formed with leadframe 54 and tiebar 62a, and structure elements 80, 86 are coupled to tiebar 62a by insulating material 88.

FIGS. 8-12 are top views of other leadframes of other semiconductor packages according to other embodiments. In each of the top views a portion of the encapsulating material of the semiconductor packages has been removed to identify the leadframe and the structure elements coupled to the leadframe.

Figure 8:
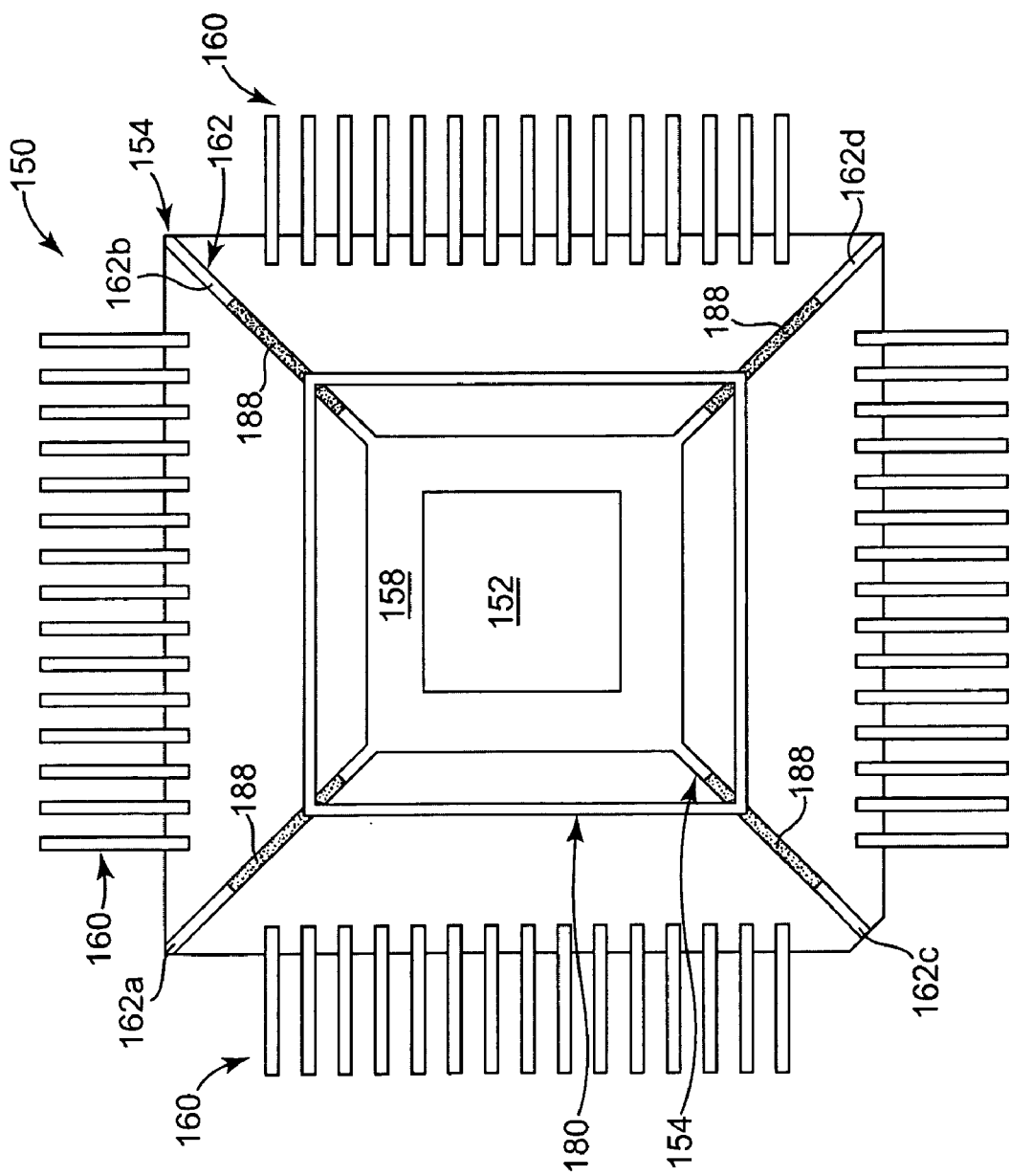
FIGS. 8-12 are top views of other leadframes of other semiconductor packages according to other embodiments.

FIG. 8 is a top view of another semiconductor package 150 including a chip 152 coupled to a leadframe 154. Leadframe 154 includes die pad 158 to which chip 152 is coupled, leads 160 configured for electrical communication with die pad 158 and/or chip 152, and tiebars 162 extending from die pad 158. In one embodiment, leadframe 154 is stamped from copper and includes four tiebars 162a, 162b, 162c, 162d extending from a respective corner of die pad 158.

In one embodiment, a first structure element 180 is provided that is separate from and coupled to leadframe 154. For example, in one embodiment structure element 180 is a metal ring disposed about a periphery of die pad 158 and is coupled to tiebars 162a-d by an electrically isolating adhesive material 188. In one embodiment, structure element 180 is a power ring. In another embodiment, structure element 180 is a ground ring. As described above, structure element 180 is configured for selective electrical connection to any of the leads 160.

Figure 9:
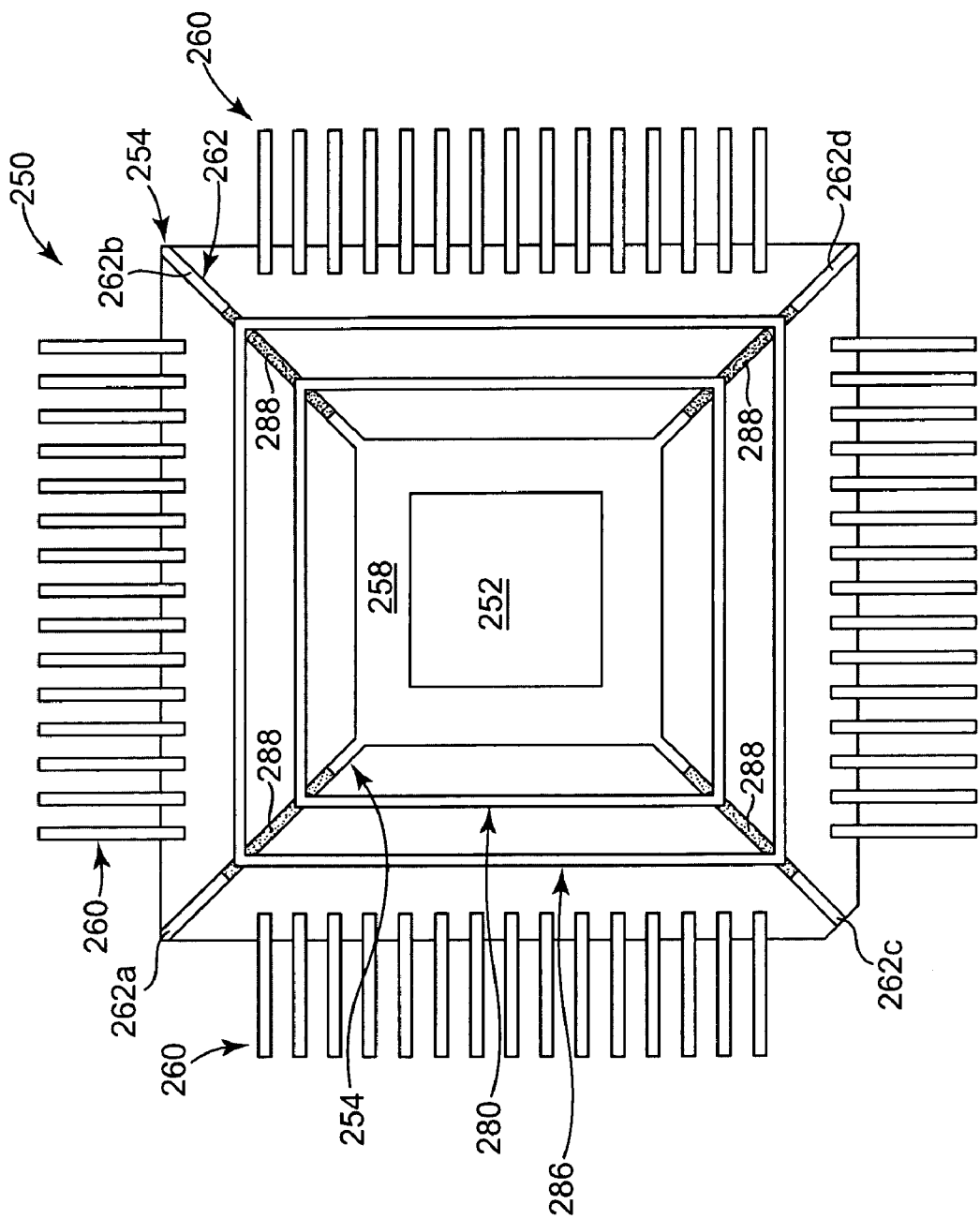

FIG. 9 is a top view of a semiconductor package 250 according to another embodiment. Semiconductor package 250 includes a chip 252 coupled to a leadframe 254. Leadframe 254 includes a die pad 258, leads 260 configured for electrical communication with die pad 258 and/or chip 252, and tiebars 262 extending from corners of die pads 258. In one embodiment, leadframe 254 is stamped from copper and includes four tiebars 262a-262d extending from respective corners of die pad 258.

In one embodiment, a first structure element 280 is disposed around a periphery of die pad 258 and is coupled to tiebars 262a-262d by an electrically isolating material 288. In one embodiment, a second structure element 286 is disposed about a periphery of die pad 258 and around a periphery of first structure element 280, and is likewise provided separate from and coupled to tiebars 262 by electrically isolating material 288. In one embodiment, first structure element 280 is disposed around a periphery of die pad 258 and is coupled to tiebars 262a-262d by an electrically isolating material 288, electrical connections are made to first structure element 280, an upper portion of first structure element 280 is electrically isolated, and second structure element 286 is disposed on top of first structure element 280 in a stacked arrangement.

In one embodiment, first structure element 280 is a ground ring, and second structure element 286 is a power ring. In other embodiments, first structure element 280 is a power/ground ring and second structure element 286 is also a power/ground ring. Embodiments provide multiple power/ground rings 280, 286 that are configured to be electrically coupled with any of the leads 260. In one embodiment, more than two structure elements are provided separately from and are coupled to tiebars 262 by electrically isolating material 288.

Figure 10:
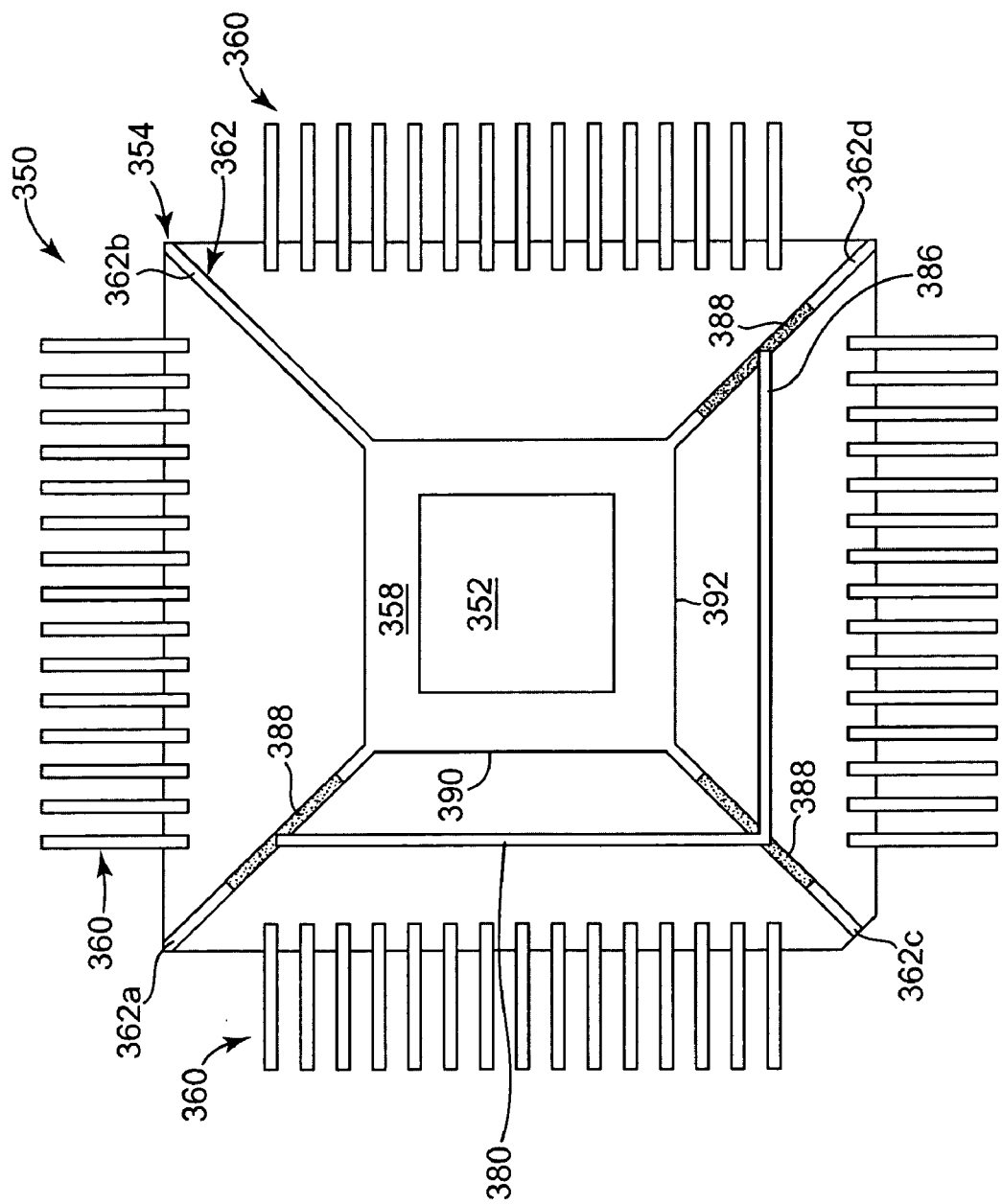

FIG. 10 is a top view of a semiconductor package 350 according to another embodiment. Semiconductor package 350 includes a chip 352 coupled to a leadframe 354. Leadframe 354 includes a die pad 358, leads 360 configured to electrically communicate with die pad 358 and chip 352, and tiebars 362 extending from die pad 358.

In one embodiment, tiebars 362 include a first tiebar 362a, a second tiebar 362b, a third tiebar 362c, and a fourth tiebar 362d, where each of the tiebars 362 extend from a respective corner of die pad 358. In one embodiment, tiebars 362a is apposed to tiebar 362b and apposed to tiebar 362c.

In one embodiment, die pad 358 defines a first side 390 and a second side 392, and first structure element 380 is disposed adjacent to first side 390 and second structure element 386 is disposed adjacent to second side 392. In one embodiment, a first structure element 380 is provided separate from leadframe 354 and coupled between apposed tiebars 362a, 362c by an electrically isolating adhesive material 388, and a second structure element 386 is provided separate from leadframe 354 and first structure element 380 and coupled between apposed tiebars 362c, 362d by an electrically isolating adhesive material 388.

In one embodiment, first structure element 380 is a metallic strip, and second structure element 386 is a metallic strip disposed on one side of tiebars 362a, 362c, 362d. In one embodiment, first structure element 380 and second structure element 386 are maintained at the same reference voltage and are configured to be selectively electrically connected to any of leads 360. In other embodiments, structure elements 380, 386 are maintained at a different voltage. In this and in other embodiments, first structure element 380 includes one of a ground bus or a power bus and second structure element 386 includes one of a ground bus or a power bus. The buses need not be rings and need not be parallel one to the other.

Figure 11:
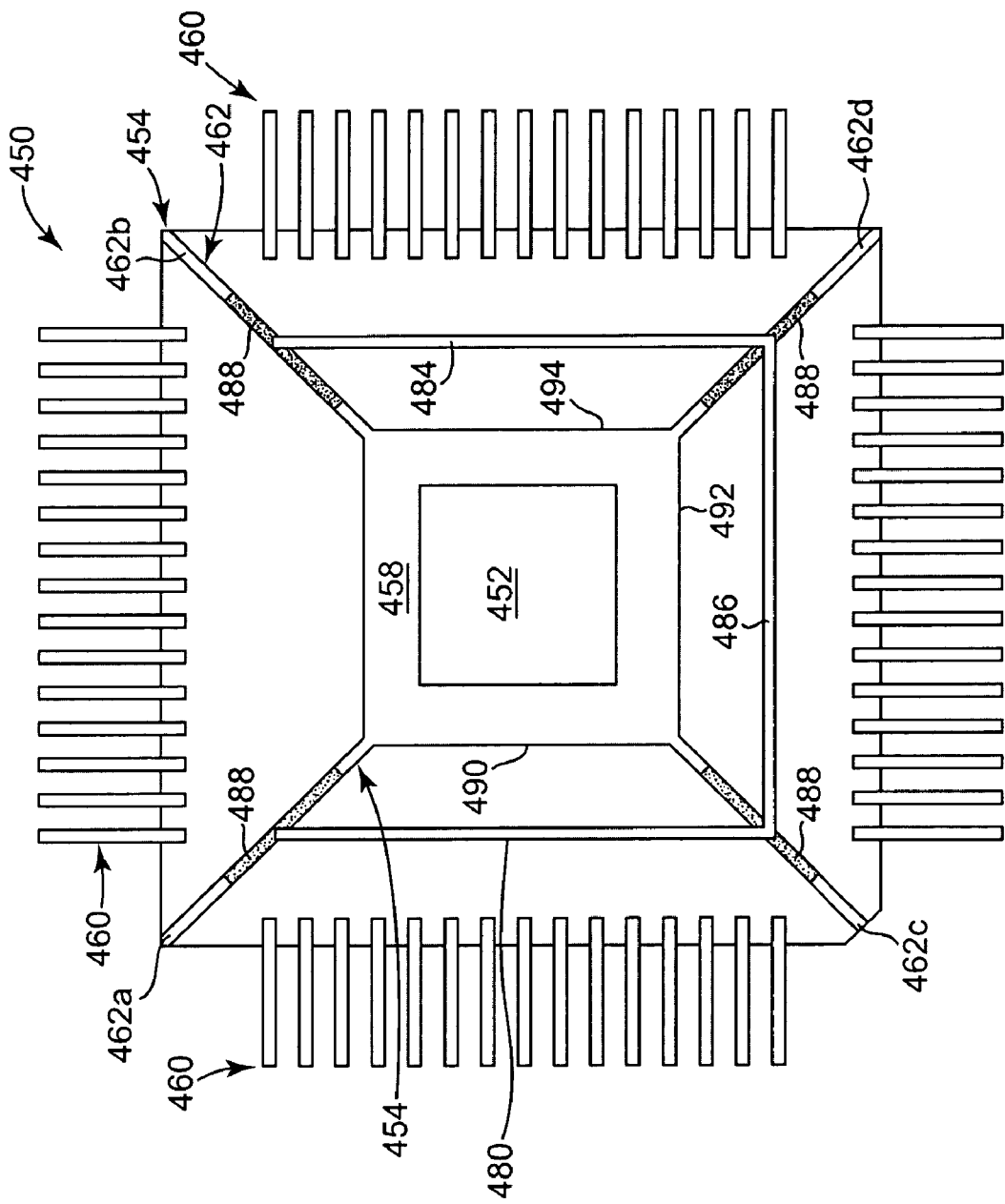

FIG. 11 is a top view of a semiconductor package 450 according to another embodiment. Semiconductor package 450 includes a chip 452 coupled to a leadframe 454. Leadframe 454 includes a die pad 458, leads 460 configured to electrically communicate with die pad 458 and chip 452, and tiebars 462 extending from die pad 458.

In one embodiment, tiebars 462 include a first tiebar 462a, a second tiebar 462b, a third tiebar 462c, and a fourth tiebar 462d, where each of the tiebars 462 extend from a respective corner of die pad 458. In one embodiment, tiebars 462a is apposed to tiebar 462b and apposed to tiebar 462c.

In one embodiment, die pad 458 defines a first side 490, a second side 492, and a third side 494, and a first structure element 480 is disposed adjacent to first side 490, a second structure element 486 is disposed adjacent to second side 492, and a third structure element 484 is disposed adjacent to third side 494.

In one embodiment, first structure element 480 is provided separate leadframe 454 from and coupled between apposed tiebars 462a, 462c, second structure element 486 is provided separate from leadframe 454 and coupled between apposed tiebars 462c, 462d, and third structure element 484 is provided separate from leadframe 454 and coupled between apposed tiebars 462b, 462d, where structure elements 480, 484, and 486 are coupled to tiebars 462 by an electrically isolating adhesive material 488.

In one embodiment, structure elements 480, 484, 486 include metallic strips. In another embodiment, structure elements 480, 484, 486 are integrally formed in a U-shaped configuration. In one embodiment, structure elements 480, 484, 486 are maintained at the same reference voltage and are configured to be selectively electrically connected to any of leads 360. In other embodiments, structure elements 480, 484, 486 are maintained at a different voltage.

Figure 12:
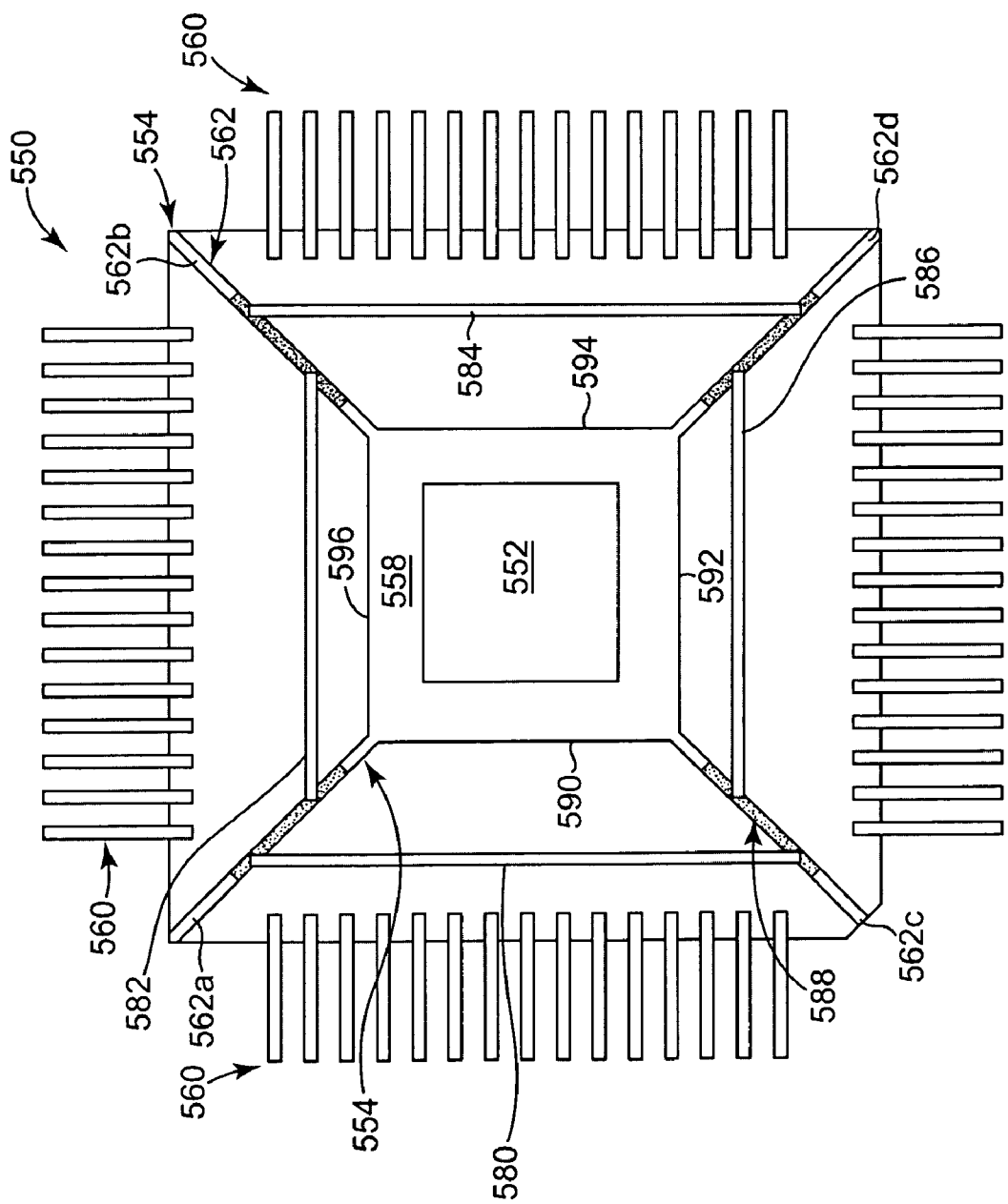

FIG. 12 is a top view of a semiconductor package 550 according to another embodiment. Semiconductor package 550 includes a chip 552 coupled to a leadframe 554. Leadframe 554 includes a die pad 558, leads 560 configured to electrically communicate with die pad 558 and chip 552, and tiebars 562 extending from die pad 558.

In one embodiment, tiebars 562 include a first tiebar 562a, a second tiebar 562b, a third tiebar 562c, and a fourth tiebar 562d, where each of the tiebars 562 extend from a respective corner of die pad 558. In one embodiment, tiebars 562a is apposed to tiebar 562b and apposed to tiebar 562c.

In one embodiment, die pad 558 defines a first side 590, a second side 592, a third side 594, and a fourth side 596, and a first structure element 580 is disposed adjacent to first side 590, a second structure element 586 is disposed adjacent to second side 592, a third structure element 584 is disposed adjacent to third side 494, and a fourth structure element 582 is disposed adjacent to fourth side 596.

In one embodiment, first structure element 580 is provided separate leadframe 554 from and coupled between apposed tiebars 562a, 62c, second structure element 586 is provided separate from leadframe 554 and coupled between apposed tiebars 562c, 562d, third structure element 584 is provided separate from leadframe 554 and coupled between apposed tiebars 562b, 562d, and fourth structure element 582 is provided separate from leadframe 554 and coupled between apposed tiebars 562a, 562b, where structure elements 580, 582, 584, and 586 are coupled to tiebars 562 by an electrically isolating adhesive material 588.

In one embodiment, structure elements 580, 582, 584, and 586 include metallic strips. In one embodiment, structure elements 580, 582, 584, and 586 are maintained at the same reference voltage and are configured to be selectively electrically connected to any of leads 360. In other embodiments, structure elements 580, 582, 584, and 586 are maintained at a different voltage.

Figure 13:
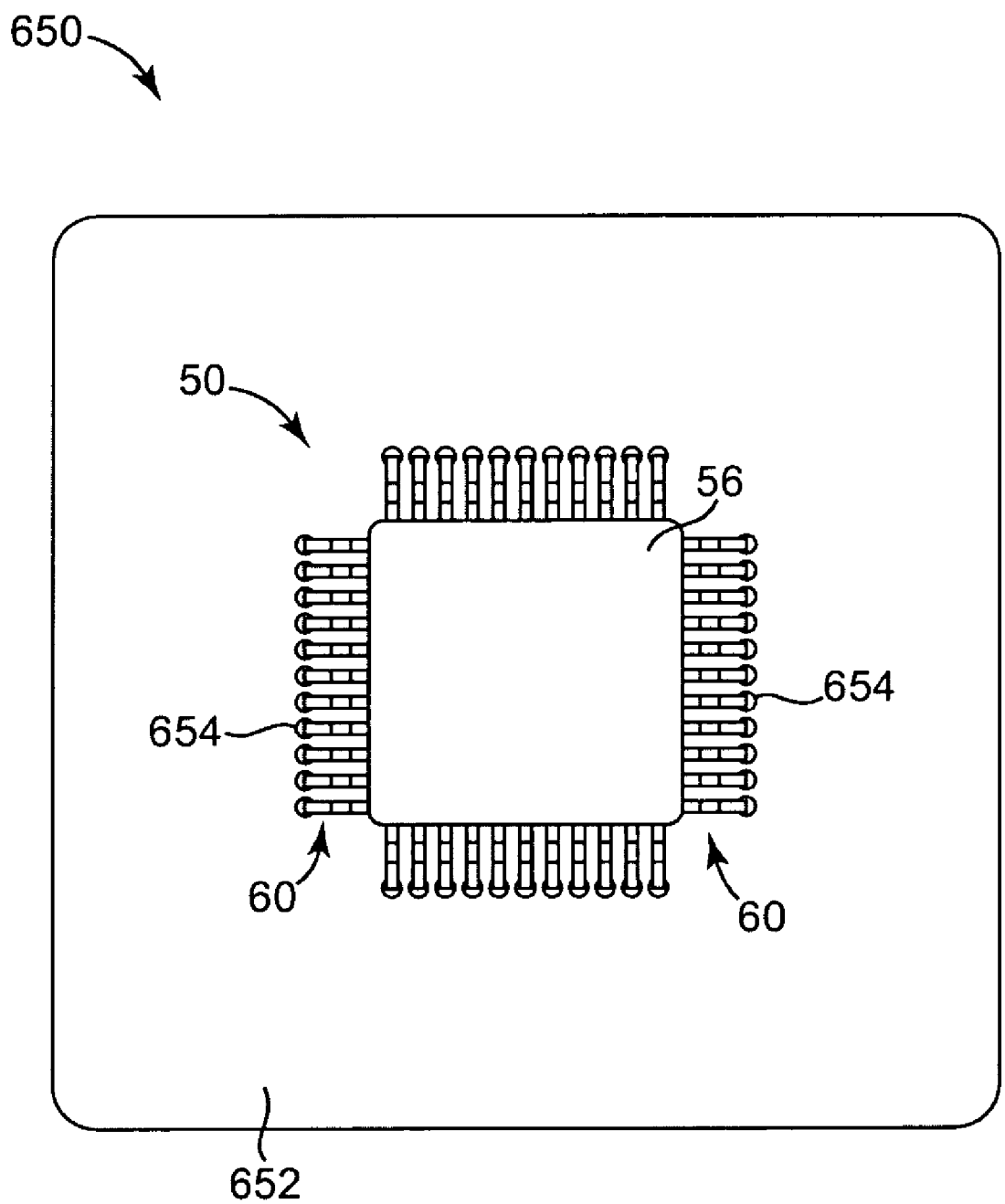
FIG. 13 is a perspective view of a semiconductor assembly including a singulated semiconductor package attached to a printed circuit board according to one embodiment.

FIG. 13 is a perspective view of a semiconductor assembly 650 according to one embodiment. Semiconductor assembly 650 includes semiconductor package 50 electrically connected to a printed circuit board 652. In one embodiment, semiconductor package 50 is substantially as described above and leads 60 are electrically connected to contacts of printed circuit board 652 by solder joints 654, for example. Embodiments of semiconductor package 50 include the semiconductor packages having leadframe configurations 50', 54, 154, 254, 354, 454, and 554 and their respective structure elements as described above.

A universal leadframe design having power/ground rings provided separately from the leads and die pad/island has been described. The universal leadframe enables lower production cost, efficiency in manufacturing and semiconductor fabrication, and accommodates a variety of product designs. The power/ground rings enable the selective connection between the power/ground rings and any one or all of the leads. To this end, the universal leadframe is compatible with and enables the use of higher frequency chip solutions and provides the semiconductor package with a higher number of available signal leads.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device comprising:
    a leadframe comprising a first face that defines an island and multiple leads configured to communicate with a chip attached to the island;
    a first electrically conductive structure element mechanically coupled to and electrically isolated from the first face of the leadframe;
    at least one electrical connector coupled between the chip and the first electrically conductive structure element; and
    at least one second electrical connector coupled between the first electrically conductive structure element and one of the multiple leads.

2. The electronic device of claim 1, further comprising:
    a second electrically conductive structure element mechanically coupled to and electrically isolated the first face of the leadframe, the second electrically conductive structure element separate from the first structure element.

3. The electronic device of claim 2, wherein the first electrically conductive structure element comprises an electrically conductive ring contiguously disposed around the island and the second structure element comprises an electrically conductive ring contiguously disposed around the island between the first structure element and the island.

4. The electronic device of claim 2, wherein the first electrically conductive structure element comprises a strip disposed adjacent to a first edge of the island and the second electrically conductive structure element comprises a strip disposed adjacent to an edge of the island other than the first edge.

5. The electronic device of claim 2, wherein the first electrically conductive structure element is electrically isolated from the second electrically conductive structure element.

6. The electronic device of claim 1, wherein the leadframe comprises at least one tiebar extending from the island, and wherein the first electrically conductive structure element is coupled to the tiebar by an electrically non-conductive adhesive material.

7. The electronic device of claim 1, wherein the first electrically conductive structure element is coupled to the first face of the leadframe via an electrically non-conductive adhesive material.

* * * * *